(12) United States Patent
Liao et al.

(10) Patent No.: US 7,205,634 B2
(45) Date of Patent: Apr. 17, 2007

(54) MIM STRUCTURE AND FABRICATION PROCESS WITH IMPROVED CAPACITANCE RELIABILITY

(75) Inventors: Miao-Cheng Liao, Cihtong Township, Yunlin County (TW); Kuo-Hsien Cheng, Tainan (TW); Cheng-Chao Lin, Chia-Yi (TW); Shao-Ta Hsu, Tainan (TW); Ying-Lang Wang, Tien-chung Village (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 128 days.

(21) Appl. No.: 10/798,959

(22) Filed: Mar. 10, 2004

(65) Prior Publication Data

US 2005/0202616 A1  Sep. 15, 2005

(51) Int. Cl.
 *H01L 29/00* (2006.01)

(52) U.S. Cl. .................. 257/532; 257/296; 438/239; 438/957

(58) Field of Classification Search .............. 257/301, 257/302, 303, 532; 438/957
See application file for complete search history.

(56) References Cited

U.S. PATENT DOCUMENTS

| | | | |
|---|---|---|---|
| 6,759,703 B1 * | 7/2004 | Matsuhashi | 257/306 |
| 6,916,722 B2 * | 7/2005 | Huang et al. | 438/396 |
| 2002/0098644 A1 * | 7/2002 | Ohtsuki | 438/253 |
| 2005/0040481 A1 * | 2/2005 | Shimizu et al. | 257/411 |

* cited by examiner

*Primary Examiner*—Long Tran
(74) *Attorney, Agent, or Firm*—Tung & Associates

(57) ABSTRACT

An MIM structure and method for forming the same the method including forming a bottom conductive electrode overlying a semiconducting substrate; forming a first protection layer on the conductive electrode; forming a dielectric layer on the first protection layer; and, forming an upper conductive electrode on the dielectric layer to form a metal-insulator-metal (MIM) structure.

32 Claims, 2 Drawing Sheets

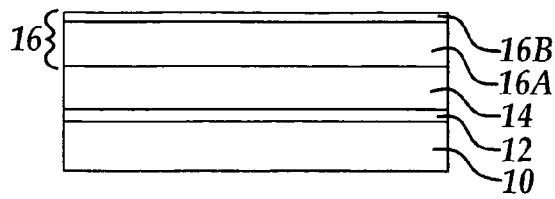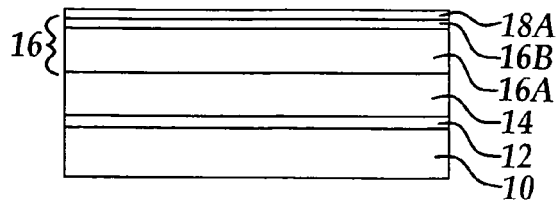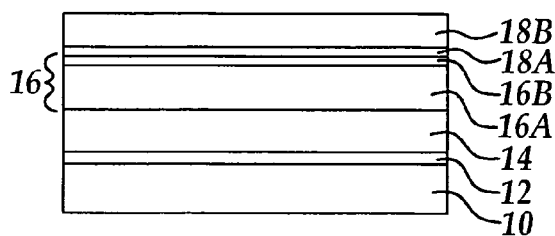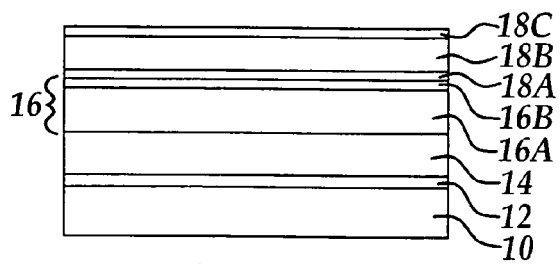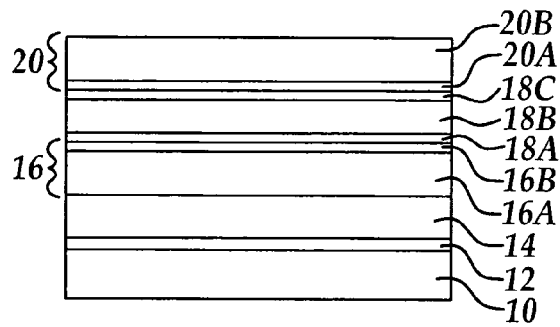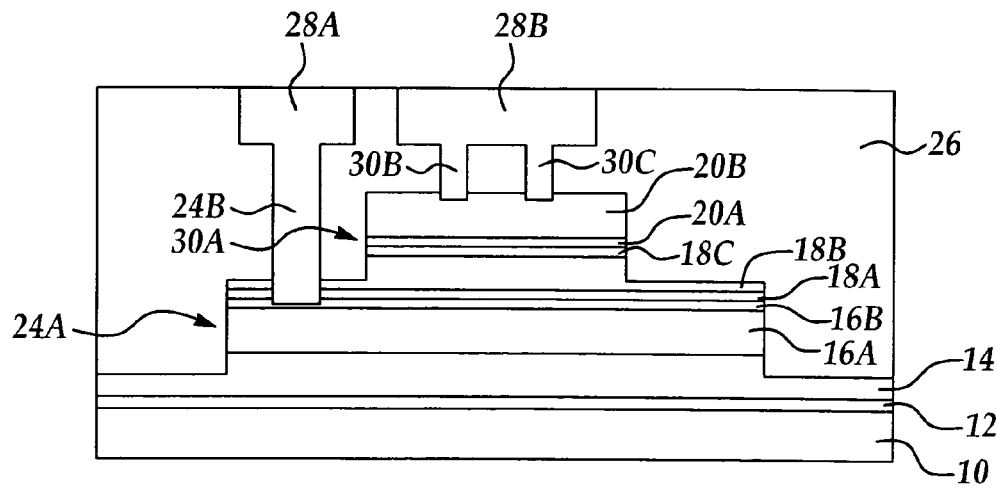

MIM STRUCTURE AND FABRICATION PROCESS WITH IMPROVED CAPACITANCE RELIABILITY

FIELD OF THE INVENTION

This invention generally relates to metal-insulator-metal structures and more particularly to an MIM structure and method for depositing plasma enhanced oxide to achieve a MIM capacitor structure with improved capacitance reliability.

BACKGROUND OF THE INVENTION

Advances in technology have resulted in an increasing demand for system-on-chip products where both analog and digital signal processing are desirable. For example analog circuits capture an analog signal from the surrounding environment and transform the signal into bits which are then transformed into signals for driving digital circuitry and output functions. Increasingly it is advantageous to have both the analog circuitry and digital circuitry in close proximity, for example in the form digital blocks and analog blocks of circuitry which function together to implement the function of the system, also referred to as mixed mode systems.

One immediate problem with the integration of analog and digital circuitry blocks is the increase in power consumption. The design constraints that inform the design of digital blocks include the need for fast signal transmission and low power consumption. On the other hand in analog circuitry, as device sizes have decreased, the power supply to the circuitry has been decreased, leading to susceptibility of a signal to noise levels in the circuitry. As a result, a differential signal is frequently used including a local Vdd boost to decrease sensitivity to thermal noise.

In metal-insulator-metal (MIM) structures, which are included in analog circuitry building blocks, low and reliably produced stable capacitances are of primary importance, for example in digital/analog converters, since low capacitance values require less power.

Many analog and mixed mode systems rely on precise reproducibility in the electronic properties of circuit component structures, such as MIM structures, to achieve the electrical matching of the various circuitry components. Electronic mismatch of circuitry components results in reduced signal processing quality and is adversely affected by deviations in processing conditions or the physical stability of component structures in processing and operating environments, for example a capacitance value of an MIM structure.

The capacitance of an MIM capacitor structure may be affected by several variables including the thickness of the capacitive dielectric layer which may be adversely affected by processing and operating conditions.

There is therefore a continuing need in the semiconductor device processing art for improved MIM capacitor structures and manufacturing processes to achieve reproducibly reliable and consistent electrical properties including capacitance.

It is therefore an object of the invention to provide improved MIM capacitor structures and manufacturing processes to achieve reproducibly reliable and consistent electrical properties including capacitance, while overcoming other deficiencies and shortcomings of the prior art.

SUMMARY OF THE INVENTION

To achieve the foregoing and other objects, and in accordance with the purposes of the present invention, as embodied and broadly described herein, the present invention provides an MIM structure and method for forming the same with improved capacitance reliability by reducing interdiffusion of an MIM electrode and capacitive dielectric.

In a first embodiment, the method includes forming a bottom conductive electrode overlying a semiconducting substrate; forming a first protection layer on the conductive electrode; forming a dielectric layer on the first protection layer; and, forming an upper conductive electrode on the dielectric layer to form a metal-insulator-metal (MIM) structure.

These and other embodiments, aspects and features of the invention will become better understood from a detailed description of the preferred embodiments of the invention which are described in conjunction with the accompanying drawings.

BRIEF DESCRIPTION OF THE DRAWINGS

FIGS. 1A–1E are cross-sectional views of a portion of an exemplary MIM semiconductor structure at processing stages according to the present invention.

FIG. 2 is a cross-sectional view of a portion of an exemplary MIM semiconductor structure at a further processing stage according to the present invention.

DETAILED DESCRIPTION OF THE PREFERRED EMBODIMENTS

Figure 3:
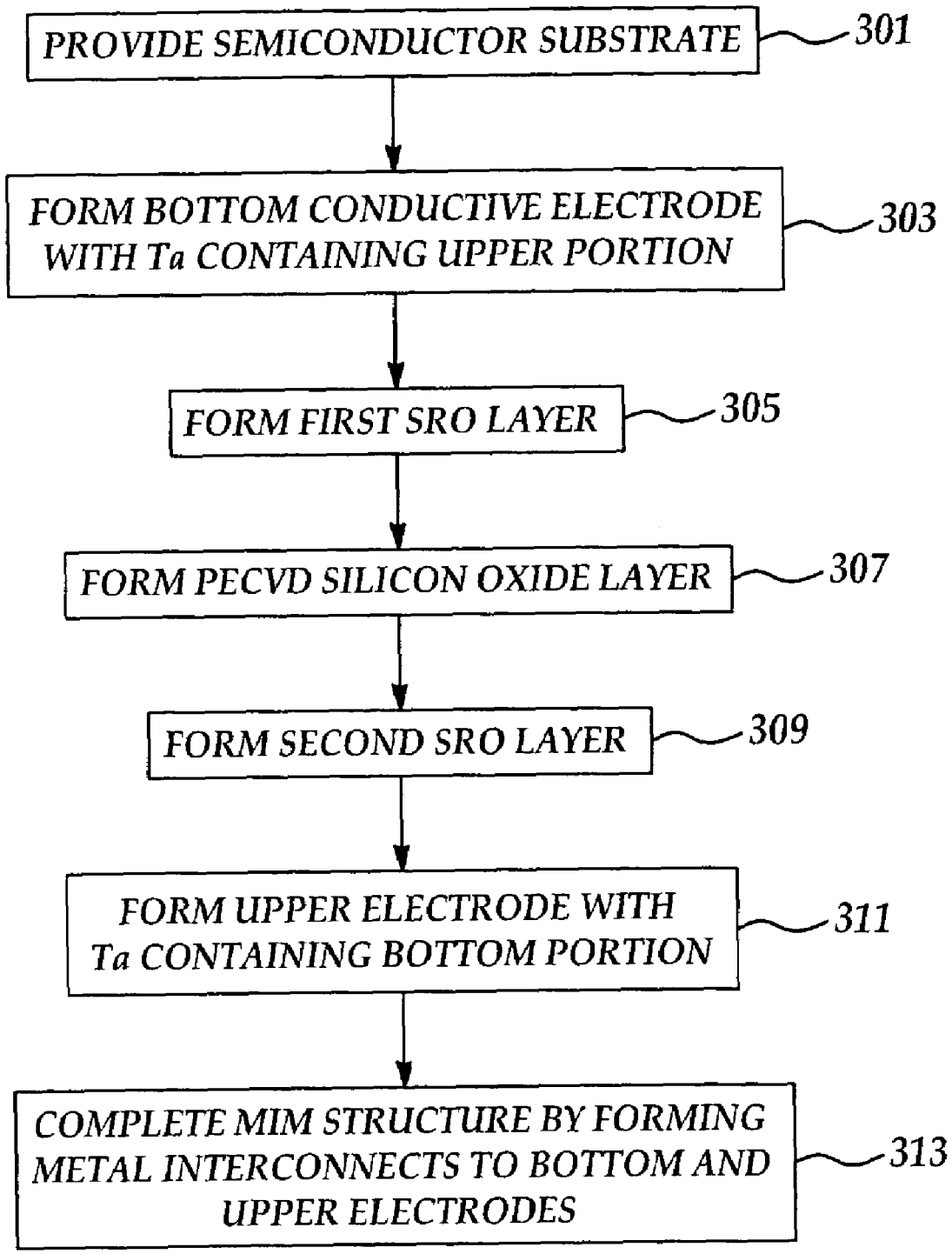
FIG. 3 is a process flow diagram including several embodiments of the present invention.

The method and MIM capacitor structure according to the present invention is more clearly described by referring to FIGS. 1A–1E where cross sectional views at stages of manufacture are shown in forming an MIM capacitor structure.

FIG. 1A shows by way of example, an embodiment of the present invention in forming an exemplary MIM structure. For example referring to FIG. 1A is shown a semiconductor substrate 10, for example silicon, having a layer of silicon nitride 12 deposited thereover by conventional methods, for example LPCVD to a thickness of about 400 to about 800 Angstroms. An undoped silicate glass (USG) layer 14 is then deposited by conventional CVD methods to a thickness of about 1000 Angstroms. A bottom conductive electrode (plate) 16 is then deposited by conventional means. Preferably, the bottom electrode 16 if formed of at least one conductive layer, for example including any conductive metal, more preferably aluminum-copper (AlCu) alloy, tantalum (Ta), titanium (Ti), tungsten (W), with preferably an uppermost layer of tantalum (Ta), tantalum nitride (TaN), or TaSiN.

It will be appreciated that the underlying USG layer 14 is not required according to the present invention and is typically deposited as a field oxide, for example acting as an etch stop layer and as a dielectric medium for forming other structures including metal damascenes. For example, it will be appreciated that the bottom electrode 16 may be deposited over a silicon nitride layer 12.

In a preferred embodiment, the bottom electrode 16 includes a lower layer of Ta 16A with an overlying layer of TaN 16B as an uppermost portion which is preferably silicided to form TaSiN deposited by conventional methods, for example PVD deposition of Ta followed by deposition of TaN layer 16B by an ion metal plasma (IMP) process, followed by plasma enhanced silicidation, using a silane, or chlorosilare source, for example disilane, or dichlorosilane, to treat the TaN layer. The thickness of the bottom electrode 16 may range from about 500 Angstroms to about 1500 Angstroms.

Referring to FIG. 1B, following formation of the bottom electrode 16, e.g., 16A and 16B, according to an aspect of the invention, a thin layer of silicon rich-oxide (SRO) 18A, for example from about 25 Angstroms to about 200 Angstroms is optionally deposited, preferably according to a PECVD method to form an SRO layer having a refractive index of greater than about 1.48. The SRO layer 18A is preferably formed by supplying plasma source gases to form a plasma, preferably including silane ($SiH_4$) and at least one of nitric oxide (NO) and $N_2O$ (nitrous oxide), more preferably $N_2O$, for PECVD deposition at a temperature of about 200° C. to about 450° C. It will be appreciated that high density RF plasma processes such as HDP-CVD may be used as well.

It will be appreciated that the silicon containing plasma gas source for the PECVD deposition may include silane and/or chlorosilane source gases including silane ($SiH_4$), disilane ($Si_2H_6$), trisilane ($Si_3H_8$), dichlorosilane ($SiH_2Cl_2$), trichlorosilane ($SiHCl_3$), or mixtures thereof. Preferably, the PECVD deposition is preceded by forming a plasma from the silicon containing source gas source gas and an inert dilution gas, for example argon, to form a silicided TaN layer, e.g., TaSiN in-situ prior to adding the $N_2O$ and/or NO flow to deposit the SRO layer. The silicon rich oxide (SRO) layer (e.g., protection layer) is formed by the relatively higher degree of incorporation of nitrogen and hydrogen into the $SiO_2$ layer resulting in a higher density SRO layer with a refractive index greater than the value for conventional stoichiometric PECVD $SiO_2$ of about 1.46, for example, preferably greater than about 1.48.

Referring to FIG. 1C, a PECVD silicon oxide layer 18B is then deposited in-situ over the SRO layer 18A to a thickness of between about 350 Angstroms and about 400 Angstroms depending on the desired capacitance of the MIM and the thickness of the underlying SRO layer. Preferably, the PECVD oxide layer 18B, also referred to as PE Oxide, is formed with a relatively lower amount of silicon compared to the SRO layer 18A, for example at or above a conventional $SiO_2$ stoichiometry as indicated by a refractive index of about 1.46. More preferably, the PECVD oxide layer is formed with a refractive index of about 1.45 to about 1.48, depending on the desired capacitance of the MIM structure.

Referring to FIG. 1D, following deposition of the PECVD oxide layer 18B, a second (upper) SRO layer 18C (e.g., protection layer) is optionally deposited over the PECVD oxide layer 18B in-situ, similar to first SRO layer 18A, preferably formed with a relatively higher silicon stoichiometry (silicon rich) compared to stoichiometric $SiO_2$ as indicated by having a refractive index of greater than about 1.48 and at a thickness of about 25 Angstroms to about 200 Angstroms.

Referring to FIG. 1E, an upper conductive electrode 20, including at least one conductive layer formed of the same or different metals as the first electrode 16 is deposited by conventional methods including PVD, IMP, CVD, and PECVD. In one embodiment, the upper conductive electrode 20 includes deposition of a lowermost TaN electrode layer 20A, followed by deposition of an uppermost Ta layer 20B, for example, formed by an ion metal plasma (IMP) process.

It will be appreciated that the lowermost conductive layer may be formed of one of Ta, TaN, TaSiN, more preferably a TaSiN portion in contact with the upper (second) SRO layer 18C. The thickness of the upper electrode is preferably between about 500 Angstroms and about 1500 Angstroms.

According to the present invention, it has been found that the SRO layers e.g., 18A and 18C which are formed to sandwich the PE Oxide layer 18B act to prevent undesired reactions at an electrode/PE Oxide interface including inter-diffusion of Si and O from the PE Oxide layer and Ta or nitrogen from the adjacent Ta, TaN, or TaSiN electrode layers. For example, without the SRO layers according to the prior art methods, reaction between the PECVD oxide layer and the electrodes occurs, causing thinning of the PECVD Oxide layer (capacitive dielectric) and roughening of the electrode surface which degrades the capacitance value and Q factor of the MIM structure. It is believed that interdiffusion between the PECVD oxide layer and the electrodes causes thinning of the PECVD layer as well as spiking of interstitial Ta atoms across the electrode/PECVD interface to form capacitive dielectric composites thereby degrading capacitive behavior, eventually cases causing electrical shorting and early failure of the MIM structure.

According to the present invention, the beneficial effect of the SRO sandwiching layers in reducing or preventing interdiffusion between the PECVD oxide layer and the electrodes is believed to be related to the relatively higher density of the SRO layers, as evidenced by the refractive index, compared to the PECVD oxide layer as well as the increased presence of nitrogen in the $SiO_2$ lattice to thereby inhibiting lattice diffusion across the SRO layer interface. In addition, it has been found that silicidation of the electrode layer surface, for example TaN to form TaSiN together with an adjacent intervening SRO layer between the electrode and PECVD layer further improves a resistance to interfacial diffusion, believed to be due to the higher atomic binding energy of Ta to Si. As a result, the MIM structure can reproducibly achieve design capacitances with closer tolerances while forming more stable and reliable MIM structures. In addition, electronic matching of capacitance components with other electronic components in a mixed mode system, especially for smaller design technologies including to 0.13 microns and below is improved thereby improving overall device operability.

Referring to FIG. 2, an exemplary MIM structure is completed by, conventional photolithographical patterning and RIE etching to form the upper and bottom portions 24A and 24B, for example by a first etch process stopping on the USG layer 14 and a second etch process stopping on the PE Oxide layer 18B, respectively. Next, an overlying dielectric insulating layer 26 is deposited. Dual or single Damascene interconnects are then patterned and RIE etched by conventional processes followed by filling with metal, for example copper by an electro-chemical plating process, to form copper electrodes 28A, 28B and copper landing interconnects (e.g. vias) 30A, 30B, 302, 30C.

Referring to FIG. 3 is a process flow diagram including several embodiments of the present invention. In process 301, a semiconductor substrate is provided. In process 303 a bottom electrode is deposited according to preferred embodiments including an uppermost tantalum containing portion. In process 305, a first SRO layer is deposited according to preferred embodiments to contact the upper portion of the bottom electrode. In process 307, a PECVD silicon oxide layer is deposited according to preferred embodiments. In process 309, a second SRO layer is deposited over the PECVD oxide layer to form a PECVD oxide layer sandwiched by the first and second SRO layers. In process 311, an upper electrode is deposited including a lowermost Ta containing bottom portion adjacent and contacting the second SRO layer. In process 313, the MIM structure is completed by conventional processes to include forming electrodes and interconnects.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. An MIM capacitor structure comprising a protection layer to prevent interdiffusion of electrode metal and capacitor dielectric material:
    a bottom non-oxide conductive electrode comprising said metal;
    a first protection layer comprising silicon rich oxide (SRO) on the bottom conductive electrode, said SRO having a relatively higher silicon content compared to stoichiometric $SiO_2$;
    a dielectric layer comprising silicon oxide on the first protection layer; and,
    an upper non-oxide conductive electrode on the dielectric layer comprising said metal.

2. The MIM capacitor structure of claim 1, wherein an uppermost portion of the bottom and upper conductive electrodes comprise a material selected from the group consisting of Ta, TaN, and TaSiN.

3. The MIM capacitor structure of claim 1, wherein the dielectric layer comprises PECVD silicon oxide.

4. The MIM capacitor structure of claim 1, wherein the first protection layer is formed having a thickness between about 25 Angstroms and about 200 Angstroms.

5. The MIM capacitor structure of claim 1, wherein the upper and bottom conductive electrodes comprise a metal selected from the group consisting of aluminum, copper, tantalum, tungsten, titanium, and alloys thereof.

6. The MIM capacitor structure of claim 1, wherein the first protection layer has a higher density including refractive index compared to the dielectric.

7. The MIM capacitor structure of claim 1, wherein the first protection layer comprises a nitrogen containing silicon rich oxide (SRO) having a relatively higher silicon content compared to stoichiometric $SiO_2$.

8. The MIM capacitor structure of claim 1, further comprising a second protection layer disposed between the dielectric layer and the upper conductive electrode.

9. The MIM capacitor structure of claim 8, wherein the second protection layer comprises a silicon rich oxide (SRO) having a relatively higher silicon content compared to stoichiometric $SiO_2$.

10. The MIM capacitor structure of claim 8, wherein the second protection layer is formed having a thickness between about 25 Angstroms and about 200 Angstroms.

11. The MIM capacitor structure of claim 8, wherein the second protection layer has a higher density including refractive index compared to the dielectric.

12. The MIM capacitor structure of claim 8, wherein the second protection layer comprise a nitrogen containing silicon rich oxide (SRO) having a relatively higher silicon content compared to stoichiometric $SiO_2$.

13. The MIM capacitor structure of claim 8, wherein the bottom electrode and first protection layer have a wider dimension compared to the upper electrode and second protection layer.

14. An MIM capacitor structure to prevent interdiffusion of electrode metal and capacitor dielectric material to achieve a stable capacitance comprising:
    a bottom non-oxide conductive electrode comprising tantalum;
    a bottom protection layer comprising silicon rich oxide (SRO) on said bottom conductive electrode;
    a dielectric layer comprising an oxide on the bottom conductive electrode;
    a top protection layer comprising silicon rich oxide (SRO) on the dielectric layer; and,
    an upper non-oxide conductive electrode comprising tantalum on the top protection layer.

15. The MIM capacitor structure of claim 14, wherein the top protection layer comprises the silicon rich oxide (SRO) having a relatively higher silicon content compared to stoichiometric $SiO_2$.

16. The MIM capacitor structure of claim 14, wherein the bottom protection layer comprises the silicon rich oxide (SRO) having a relatively higher silicon content compared to stoichiometric $SiO_2$.

17. The Mill capacitor structure of claim 14, wherein an uppermost portion of the upper and bottom conductive electrodes comprise a material selected from the group consisting of Ta, TaN, and TaSiN.

18. The MIM capacitor structure of claim 14, wherein the dielectric layer comprises silicon oxide.

19. The MIM capacitor structure of claim 14, wherein the top protection layer is formed having a thickness between about 25 Angstroms and about 200 Angstroms.

20. The MIM capacitor structure of claim 14, wherein the bottom protection layer is formed having a thickness between about 25 Angstroms and about 200 Angstroms.

21. The MIM capacitor structure of claim 14, wherein the upper and bottom conductive electrodes comprise a metal selected from the group consisting of aluminum, copper, tantalum, tungsten, titanium, and alloys thereof.

22. The MIM capacitor structure of claim 14, wherein the bottom and top protection layers have a higher density including refractive index compared to the dielectric.

23. The MIM capacitor structure of claim 14, wherein the bottom electrode and bottom protection layer have a wider dimension compared to the top electrode and top protection layers.

24. The MIM capacitor structure of claim 14, wherein the bottom and top protection layers comprise a nitrogen containing silicon rich oxide (SRO) having a relatively higher silicon content compared to stoichiometric $SiO_2$.

25. An MIM capacitor structure to prevent interdiffusion of electrode metal and capacitor dielectric material to achieve a stable capacitance comprising:
    a bottom conductive electrode comprising said metal;
    a bottom protection layer comprising nitrogen containing silicon rich oxide (SRO) on said bottom conductive electrode;
    a dielectric layer on the bottom conductive electrode;
    a top protection layer comprising nitrogen containing silicon rich oxide (SRO) on the dielectric layer; and,
    an upper conductive electrode on the top protection layer comprising said metal.

26. The MIM capacitor structure of claim 25, wherein an uppermost portion of the upper and bottom conductive electrodes comprise a material selected from the group consisting of Ta, TaN, and TaSiN.

27. The MIM capacitor structure of claim 25, wherein the dielectric layer comprises silicon oxide.

28. The MIM capacitor structure of claim 25, wherein the top protection layer is formed having a thickness between about 25 Angstroms and about 200 Angstroms.

29. The MIM capacitor structure of claim 25, wherein the bottom protection layer is formed having a thickness between about 25 Angstroms and about 200 Angstroms.

30. The MIM capacitor structure of claim 25, wherein the upper and bottom conductive electrodes further comprise a metal selected from the group consisting of aluminum, copper, tantalum, tungsten, titanium, and alloys thereof.

31. The MIM capacitor structure of claim 25, wherein the bottom and top protection layers have a higher density including refractive index compared to the dielectric.

32. The MIM capacitor structure of claim. 25, wherein the bottom electrode and bottom protection layer have a wider dimension compared to the top electrode and top protection layers.

* * * * *